(12) United States Patent
Schipke et al.

(10) Patent No.: US 6,442,725 B1
(45) Date of Patent: Aug. 27, 2002

(54) SYSTEM AND METHOD FOR INTELLIGENT ANALYSIS PROBE

(75) Inventors: Brian Clay Schipke; O Bryan Call, Jr.; Steven Wayne Adams; Michael Jon Dotseth; Gordon A Greenley, all of Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/252,393

(22) Filed: Feb. 18, 1999

(51) Int. Cl.$^7$ .......................... G01R 31/28; G06F 11/00
(52) U.S. Cl. ........................................ 714/741
(58) Field of Search ..................... 714/724, 741

(56) References Cited

U.S. PATENT DOCUMENTS

| | | | | |
|---|---|---|---|---|
| 3,754,098 A | * | 8/1973 | Abramson et al. | 375/371 |
| 5,375,228 A | * | 12/1994 | Leary et al. | 714/33 |
| 5,754,827 A | * | 5/1998 | Barbier et al. | 703/14 |
| 5,884,066 A | * | 3/1999 | Kuijsten | 703/28 |
| 5,896,552 A | * | 4/1999 | Kowert et al. | 710/55 |
| 6,052,748 A | * | 4/2000 | Suominen et al. | 710/57 |
| 6,061,511 A | * | 5/2000 | Marantz et al. | 703/28 |
| 6,119,254 A | * | 9/2000 | Assouad et al. | 714/724 |
| 6,141,636 A | * | 10/2000 | Sarno et al. | 703/23 |

OTHER PUBLICATIONS

Beling, S.; Leary, K. and Yukna, G.; An in–circuit signal analyzer for mixed signal digital signal processor; International Conference on Acoustics, Speech, and Signal Processing, 1991; pp. 1109–1112 vol. 2.*

Ed Suominen; DSP Test Points TM, Getting digital processing into the real world; Copyright © 1997, 1998; http://www.eepatents.com.*

Dan Strassberg; Spectrum analysis: blazing trails beyond the frequency domain; Jun. 19, 1997, http://archives.e–insite.net/archives/ednmag/reg/1997/061997/13cs.htm.*

Marantz, J.; Enhanced visibility and performance in functional verification by reconstruction; Proceedings 1998 Design Automation Conference; pp. 164–169.*

* cited by examiner

*Primary Examiner*—Albert Decady
*Assistant Examiner*—Joseph D. Torres

(57) ABSTRACT

A system and method are described for providing intelligence to an analysis probe being utilized by logic analyzers. The system provides for regenerating target system internal processor data signals for analysis by a logic analyzer from data lines that are being utilized for other purposes by the target system processor. In particular, the analysis probe includes programmable logic for providing an interface between an emulation module and the target system, a memory for receiving signal reconstruction data from the emulation module, a processor for generating a data map from signal reconstruction data, and programmable logic for generating a target system internal signal from at least one of a plurality of target system data signals and the signal reconstruction data.

16 Claims, 10 Drawing Sheets

SYSTEM AND METHOD FOR INTELLIGENT ANALYSIS PROBE

BACKGROUND OF THE INVENTION

1. Field of the Invention

The resent invention generally relates to a system and method for providing intelligence to an analysis probe being utilized by logic analyzers. Specifically, the system and method of the present invention provide for regenerating data signals for analysis by a logic analyzer from data lines that are being utilized for other purposes by a target system processor.

2. Description of Related Art

As is known in the computer and software arts, when a new computer hardware and software system is developed, the system will exhibit errors. As a consequence, developers of the hardware and software systems utilize many techniques in which to check the correctness of the hardware and software and to diagnose these errors.

One of the devices that developers will often use to debug electronics is a logic analyzer. The use of logic analyzers has never been easy. One of the most difficult tasks when using a logic analyzer has been probing the device under test. Many logic analyzer vendors have dealt with this issue by providing an accessory that simplifies the task of connecting the logic analyzer to the device under test (oftentimes, a microprocessor). This device is usually called an "analysis probe."

Analysis probes usually connect to the device under test or test system with one connection that probes all desired signals at once. The user then connects a few logic analyzer adapter cables to the logic analyzer, rather than numerous individual probes. The use of an analysis probe also provides the user with inverse assembly functionality. The inverse assembly functionality consists of monitoring the signals on the processor to determine the processor instruction flow. This processor instruction flow denotes exactly what instructions are being processed on the processor at any given time. The processor instructions also include information as to what registers and memory addresses are being accessed. In order to get the inverse assembly functionality, certain data signals require probing by the logic analyzer.

Because microprocessor chip designers are continuing to integrate peripherals within the microprocessors themselves, signals necessary for inverse assembly functionality are neither being routed to pins of the package nor being multiplexed with other signals. The non-routing of signals makes it difficult for the logic analyzer to convert the signals necessary for inverse assembly into disassembly mnemonics. Disassembly mnemonics consists of constructing the instruction symbol that can represent processor instructions and operations, such as "add" (for addition) and "sub" (for subtraction).

A common example case where this occurs is the replacing of an upper address line with a write enable (i.e. chip select) when the chip select is being used. The logic analyzer needs all address lines in order to determine where the processor is executing code or reading or writing memory. If the microprocessor has a write enable (i.e. chip select) signal in place of an upper address line, the inverse assembler functionality is unable to operate on the addresses that the logic analyzer needs to generate the inverse assembly. In addition, the user is unable to view the correct address in the inverse assembler. If a user wishes to view the correct address, they cannot use the write enable (i.e. chip select) signals. Users find this extremely inconvenient since the write enable (i.e. chip select) signals are directly tied to the hardware system.

Heretofore, software developers have lacked a system and method for regenerating data signals for analysis by a logic analyzer from data lines that are being utilized for other purposes by a target system processor.

SUMMARY OF THE INVENTION

The present invention is generally directed to a system and method for regenerating internal data signals from external data lines that are being utilized for other functions by a target system processor. This allows a logic analyzer to display data signals that are actually being utilized internally by a target processor. Data signal reconstruction uses the target processor's chip selects, address, and data lines to recreate the desired internal data signals. This reconstruction is accomplished so the desired data signals can be viewed by a logic analyzer if the target processor is utilizing the desired data signal lines for tasks other than the desired data signals transmission.

The present invention further utilizes a system and method where an emulation module that allows a user to configure the analysis probe to enable data reconstruction for a variety of different target system processor configurations.

Other features and advantages of the present invention will become apparent to one with skill in the art upon examination of the following drawings and detailed description. It is intended that all such additional features and advantages be included herein within the scope of the present invention.

BRIEF DESCRIPTION OF THE DRAWINGS

The accompanying drawings incorporated in and forming a part of the specification illustrate several aspects of the present invention, and together with the description, serve to explain the principles of the invention. In the drawings.

DETAILED DESCRIPTION OF THE PREFERRED EMBODIMENT

Figure 1:
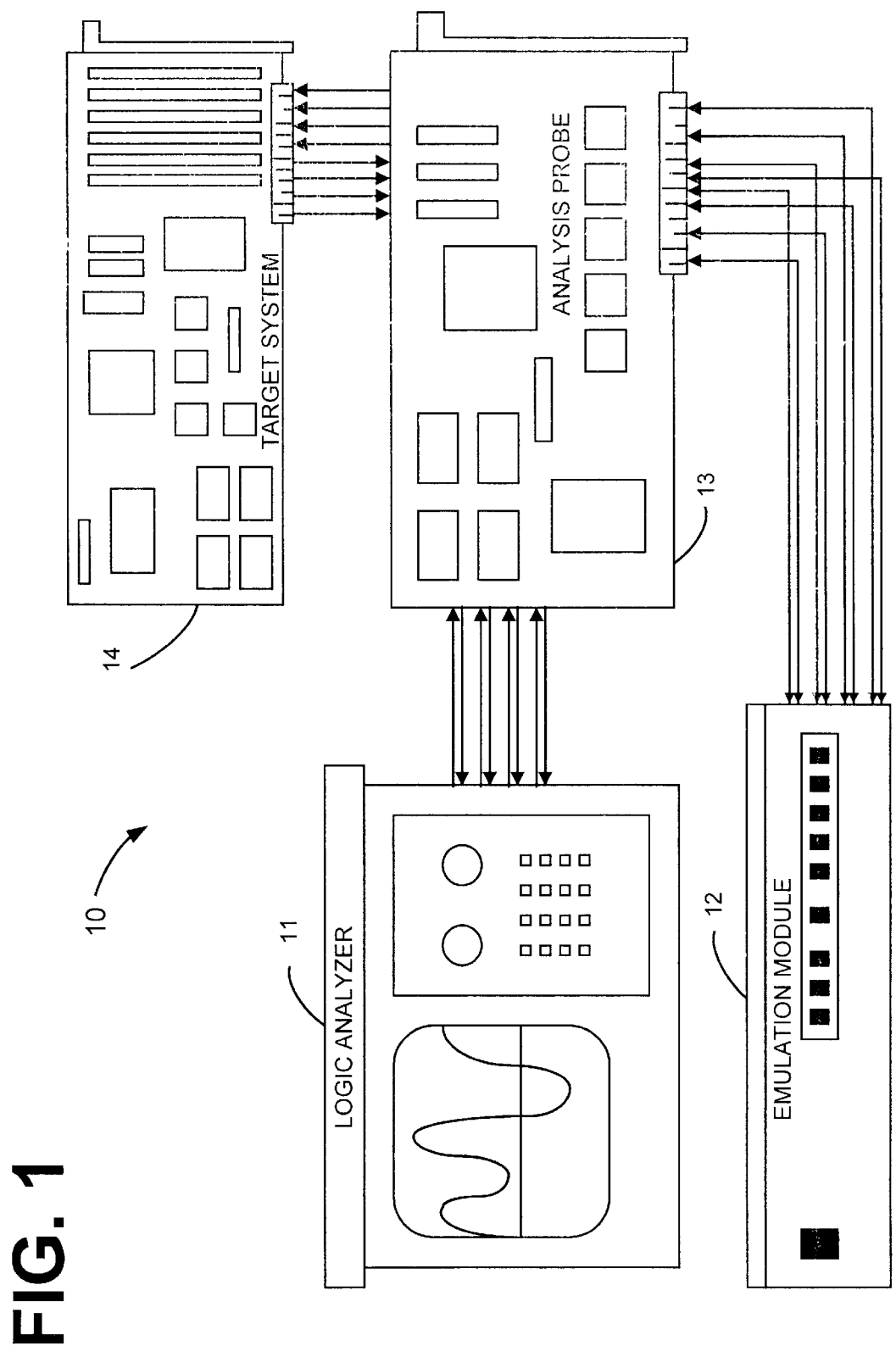
FIG. 1 is a block diagram of the logic analysis system showing the logic analyzer connected to the analysis probe that is further connected to the target system and emulation module of the present invention.

The invention will now be described with reference to the drawings, wherein like reference numerals designate corresponding parts throughout the several views. Although the invention will be described in connection with these drawings, there is no intent to limit it to the embodiment or embodiments disclosed therein. On the contrary, the intent is to include all alternatives, modifications, and equivalents included within the spirit and scope of the invention as defined by the appended claims.

Illustrated in FIG. 1 is the logic analysis system 10 of the present invention. A conventional logic analyzer 11 and a conventional target system 14 each generally comprise a processor (not shown) and a memory (not shown) which can be either one or a combination of the common types of memory, for example, but not limited to, erasable programmable read only memory (EPROM), electronically erasable programmable read only memory (EEPROM), flash memory, programmable read only memory (PROM), random access memory (RAM), read only memory (ROM), flash memory, Dynamic random access memory (DRAM), Static random access memory (SRAM), system memory, or nonvolatile memory such as disk drives, tape drives, compact disc read only memory (CD-ROM) drives, cartridges, or cassettes, etc, with an operating system (not shown). The processor accepts program code (not shown) and data (not shown) from memory over a local interface, i.e., one or more buses (not shown). Direction from the user can be signaled by using one or more input devices, for example, a mouse (not shown) and a keyboard (not shown). The actions input and result output are displayed on the display terminal (not shown).

A conventional emulation module 12 comprises a processor (not shown) and a memory (not shown) which can be either one or a combination of the common types of memory, for example, but not limited to, erasable programmable read only memory (EPROM), electronically erasable programmable read only memory (EEPROM), flash memory, programmable read only memory (PROM), random access memory (RAM), read only memory (ROM), flash memory, Dynamic random access memory (DRAM), Static random access memory (SRAM), system memory, or nonvolatile memory, etc, with an operating system (not shown). The processor accepts program code (not shown) and data from memory over a local interface, i.e., a bus (not shown).

The emulation module 12 connects to the analysis probe 13. The emulation module 12 lets a user employ the target system 14 processor's built-in background debugging features, including run control and access to registers and memory. A high level source debugger can utilize the emulation module 12 to debug code running in the target system 14. The emulation module 12 can be connected directly to the analysis probe 13 or can be connected to a debug port (not shown) on the target system 14.

The analysis probe 13 connects to the logic analyzer 11 and to the target system 14 to provide data for state and timing analysis, as is known in the art. The analysis probe 13 can be used in conjunction with the emulation module 12 or as a stand-alone component connecting to the logic analyzer 11 and target system 14. The target system 14 can be any type of computer system that contains a processing, control, or logic device. Examples are a microprocessor, central processing unit (CPU), programmable gate array, programmable logic, etc.

Also shown in FIG. 1 is the connections between the logic analyzer 11, emulation module 12, analysis probe 13, and the target system 14, as bi-directional line connections. These connections can be any type of connection, for example but not limited to, serial, parallel, optical, or other suitable connections.

The combination of the analysis probe 13, emulation module 12, and the logic analyzer 11, permits the user to both control and trace processor activity on a target system 14. The analysis probe 13 supplies signals from the target processor (not shown) to the logic analyzer 11. There are configuration files set up in the logic analyzer 11 to properly interpret these target system processor signals.

The emulation module 12 enables the user to use a debugger or emulation control functionality to configure and control the target system 14 for downloading program code. The emulation module 12 also provides for data reconfiguration of the analysis probe 13, utilizing the emulation module 12 configure features. The configuration can be accomplished in a variety of different methods. One embodiment allows reconfiguration of the analysis probe using a system debugger. Another embodiment to configure the analysis probe 13 to match the target system 14 configuration uses a manual input of the target system 14 configuration data to the emulation module 12.

Figure 2:
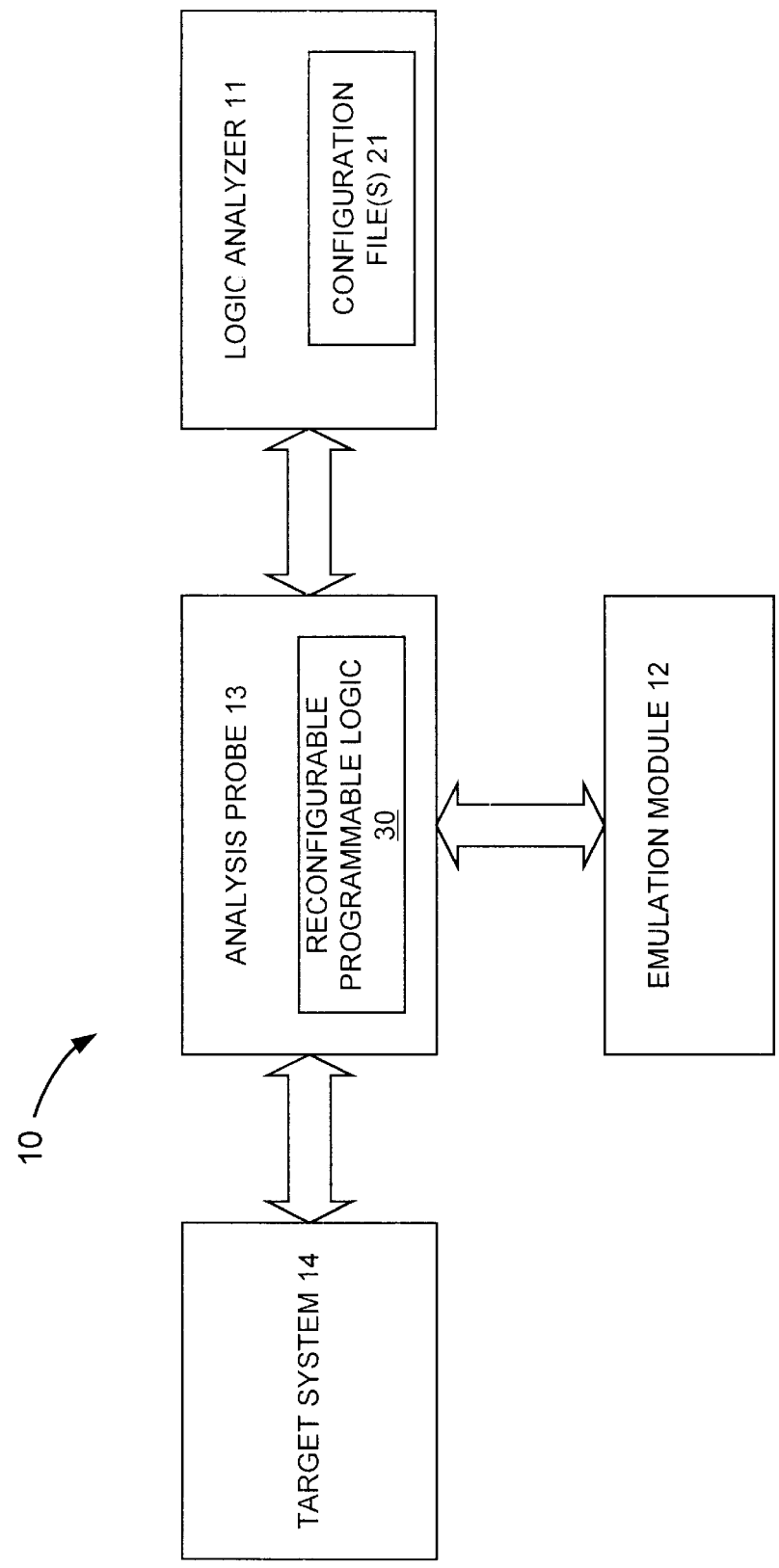
FIG. 2 is a block diagram of the logic analysis system showing the flow of data between the logic analyzer, analysis probe, target system and emulation module of the present invention.

Illustrated in FIG. 2 is the logic analysis system 10 of the present invention and in particular, the reconfigurable program logic 30 of the preferred embodiment. The reconfigurable program logic 30 within the analysis probe 13 provides the ability for the analysis probe 13 to reconstruct or reconfigure the data signals received from target system 14 for delivery to the logic analyzer 11. The reconfigurable program logic 30 of the present invention is herein explained in detail with regard to FIGS. 3 through 9.

Also shown in FIG. 2 are the configuration files 15 residing within the logic analyzer 11. These configuration files allow the logic analyzer 11 to decipher any type of signals received from the processor on the target system 14, via the analysis probe 13.

Figure 3:
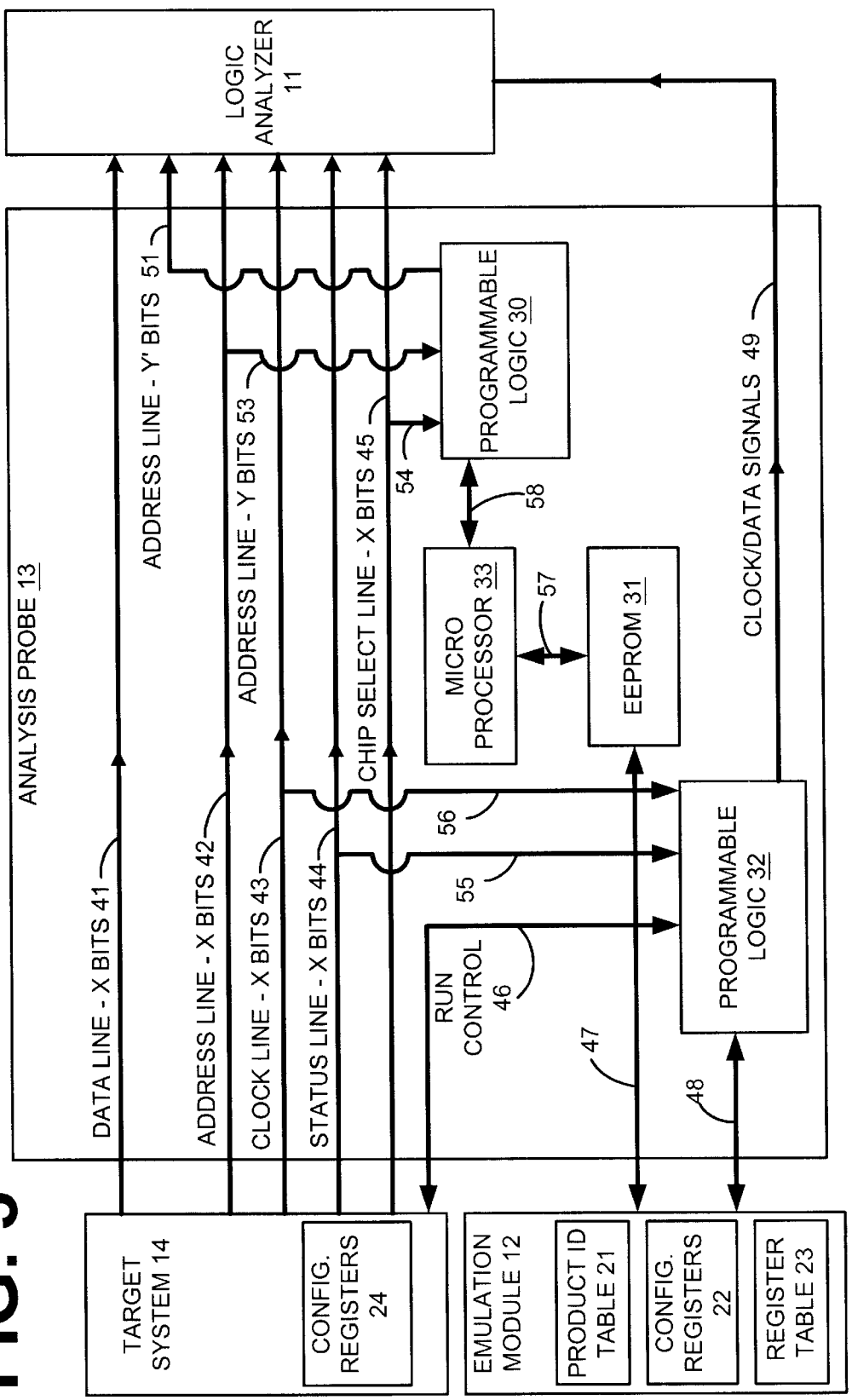
FIG. 3 is a block diagram of the logic analysis system of the present invention depicting the elements of the analysis probe along with data line connections.

Illustrated in FIG. 3 is a block diagram of the logic analysis system 10 and, in particular, the components of the analysis probe 13 of the present invention. The target system 14 is connected to the analysis probe 13. This connection allows the analysis probe 13 to receive a variety of different data signals from the target system 14. These data signals generally are embodied on parallel data lines 41 having 1 through X bit lines. Also connected to the target system 14 are the address lines 42. The target system also is connected to a clock line 43, status lines 44, and chip select lines 45. Lines 41 through 45 are further connected directly to logic analyzer 11 through the analysis probe 13. The lines 41 through 45 can be any type of connections having, for example but not limited to, 1, 2, 4, 8, 16, 32, 64, 128, 256, 512, or any other number of data lines. These lines 41 through 45 can also be any type of connection, for example but not limited to, serial, parallel, optical, or other suitable connections.

The analysis probe 13, utilizing programmable logic 32, is also connected to the target system 14 via the run control lines 46, status line 55 and clock line 56. These lines can be any type of connection having, for example, but not limited to, 1, 2, 4, 8, 16, 32, 64, 128, 256, 512, or any other member of run control lines. These lines can also be any type of connection, for example, but not limited to, serial, parallel, optical, etc. These run control lines 46 send instructions to the target system 14 processor to control the target system 14 operation. These run control lines 46 also send data to and receive data from the target system 14. The status line 55 and clock line 56 allow the analysis probe 13 to receive status and clock data, respectively, from the target system 14.

The programmable logic 32 is further connected to the emulation module 12 via data lines 48. The data lines 48 can be any type of connection having, for example, but not limited to, 1, 2, 4, 8, 16, 32, 64, 128, 256, 512, or any other number of data lines. These data lines 48 can be any type of connection, for example, but not limited to, serial, parallel, optical, or the other suitable connections. These data lines 48 allow the programmable logic 32 to send data to and receive instructions and data from the emulation module 12.

The emulation module 12 sends control instruction requests out, via data line 48, to the programmable logic 32. The programmable logic 32 acts as an interface between the emulation module 12 and the target system 14. It is also contemplated by the inventor to utilize a nonprogrammable logic circuitry, instead of programmable logic 32.

The programmable logic 32 retransmits the control instruction requests out, via run control line 46, to the target system processor configuration registers 24. The target system processor configuration registers 24, can be for example, system integration module (SIM) registers in programmable logic 32 and power PC systems manufactured by and commercially available from Motorola Corp., U.S.A. Other type target system processors that are operational with the logic analysis system 10 are, for example, but not limited to, processors manufactured by and commercially available from IBM Corp., U.S.A., and Intel Corp., U.S.A.

The programmable logic 32 reads the target system processor configuration registers 24 in to analysis probe 13 programmable logic 32. The values of the configuration registers 24 are sent to the emulation module 12 to determine which set of subset configuration registers 22 are sent to memory storage device 31. The functionality of the emulation module 12 is herein defined with reference to FIG. 4. Programmable logic 32 likewise generates clocks and other data signals 49 and transmits these signals to logic analyzer 11.

The emulation module 12 is further connected to the analysis probe 13 via data lines 47 to a memory storage device 31. Data lines 47 allow data to be sent to and from the analysis probe 13 and the emulation module 12. The data lines 47 can be any number of data lines, for example, but not limited to, 1, 2, 4, 8, 16, 32, 64, 128, 256, 512, or any other suitable number of data lines. These data lines 47 can be any type, for example, but not limited to, serial, parallel, optical, or other type of connections.

In one embodiment, the memory storage device 31 is an EEPROM-type memory device. However, it should be recognized that other non-volatile memory device types such as non-volatile ROM, RAM, EPROM, bubble memory, flash memory, or the like, could be utilized.

Figure 6:
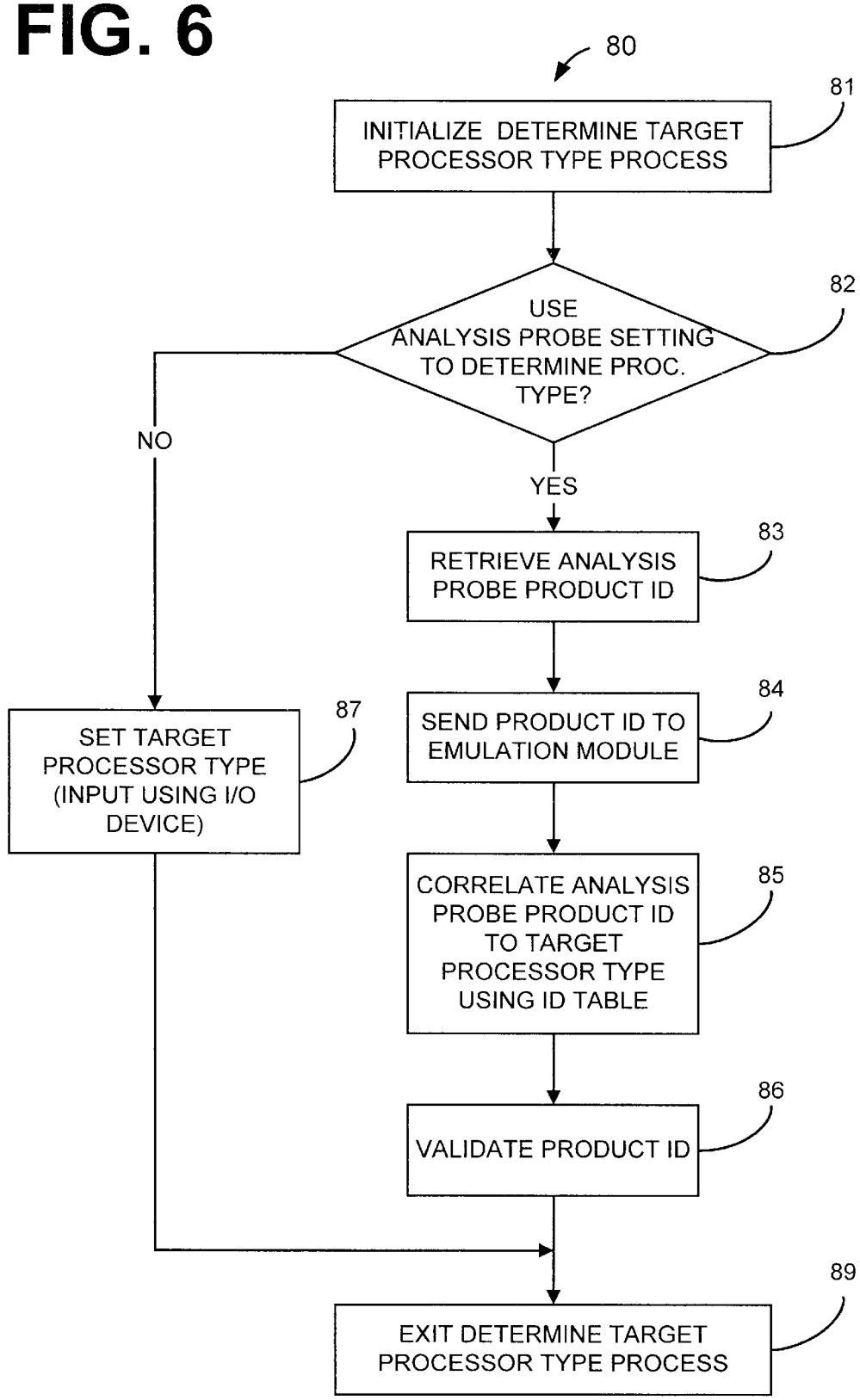
FIG. 6 is a flow chart of the process that determines the processor type of the target system as shown in FIG. 5.

Upon power up, if the emulation module 12 is connected to the analysis probe 13, the emulation module 12 determines the proper target system processor configuration registers 24 as will be herein defined in further detail with regard to FIG. 6. The emulation module 12 copies a subset of the configuration registers 24 in the target system's processor from an emulation module 12 configuration registers table 23 into the memory storage device 31. These configuration registers 24 are to be used by the analysis probe 13 to configure reconfigurable program logic 30 for data reconstruction.

The memory storage device 31 is further connected to microprocessor 33 via connection line 57. The microprocessor 33 is further connected via lines 58 to the reconfigurable program logic 30. The microprocessor 33 receives a subset of configuration registers data from the memory storage device 31 via data lines 57. The data lines 57 can be any type of connection having, for example, but not limited to, 1, 2, 4, 8, 16, 32, 64, 128, 256, 512, or any other number of data lines. These data lines 57 can be any type of connection, for example, but not limited to, serial, parallel, optical, or other suitable data line connections.

The microprocessor 33 acquires copies of the processor configuration registers 24 from the memory storage device 31, and derives a bit pattern map that is used to configure the reconfigurable program logic 30. The microprocessor 33 executes the algorithm which is implemented in a microprogram to determine the bit pattern which has been used. The data patterns are data maps that represent that a particular data input will result in a predetermined data output for data reconstruction by the analysis probe 13.

This data map created by the microprocessor 33 is then loaded into the reconfigurable program logic 30 via data line 58. The data lines 58 can be any type of connection having, for example, but not limited to, 1, 2, 4, 8, 16, 32, 64, 128, 256, 512, or any other number of data lines. These data lines 58 can be any type of connection, for example, but not limited to, serial, parallel, optical, or the like connections.

In the example of upper address line data re-creation, the reconfigurable program logic 30 receives input of a bit pattern on the chip select lines 54 and the address lines 53. The reconfigurable program logic 30 provides the data pattern input to be utilized in the mapping process for generating the resulting data output on the generated address lines 51. In the instance where the target system 14 processor does not need the upper address lines re-created, the reconfigurable program logic 30 outputs the same data input from address line 42 on address lines 51. The address lines 51 can be any type of connection having 1, 2, 4, 8, 16, 32, 64, 128, 256, 512, or any other number of data lines. These address lines 51 can be any type of serial connection, for example, but not limited to, parallel, optical, or the like connections.

The reconfigurable program logic 30 contains logic to provide for address reconstruction of the present invention. The reconfigurable program logic 30 can be either a field programmable gate array (FPGA), complex programmable logic device (CPLD), EEPROM, RAM, or the like fast memory. The reconfigurable program logic 30 is to perform the address reconstruction of the present invention. In the example of upper address reconstruction, the reconfigurable program logic 30 uses the chip selects and the address lines to re-create the upper address line bits to be viewed by the logic analyzer 11.

The reconfigurable program logic 30 contains a default configuration with all data lines 41–45 (FIG. 3) enabled. In this configuration, the logic analyzer 11 can display whatever is being probed on the data lines 41–45 (FIG. 3). In the example of upper address reconstruction, a user downloads a new configuration that uses the upper address lines for signals other than upper addresses, the reconfiguration data is contained within, and processed by, the reconfigurable program logic 30.

Figure 4:
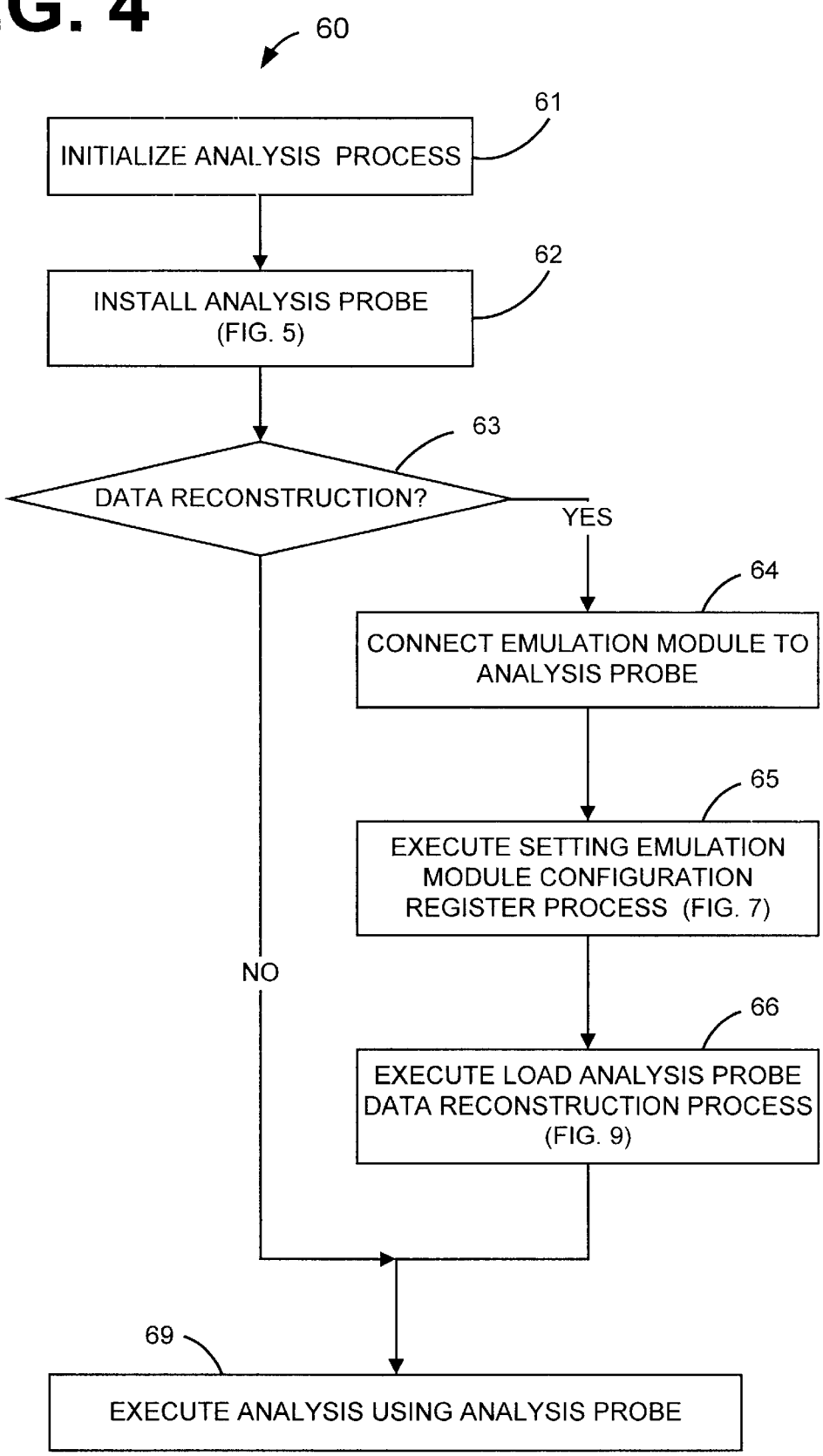
FIG. 4 is a flow chart of the method for performing the analysis process for the logic analysis system as shown in FIGS. 1, 2, and 3.

Illustrated in FIG. 4 is a flow chart of an example of possible implementation of the analysis process 60 for the logic analysis system 10 as shown in FIGS. 1, 2, and 3, using the address reconstruction method of the present invention. First, the logic analysis system 10 is initialized at step 61. The logic analysis system 10 performs the installation of the analysis probe 13 at step 62. The installation of the analysis probe 13 is herein defined in further detail with regard to FIG. 5. The logic analysis system 10 checks if data reconstruction is required at step 63. If data reconstruction is not required, the logic analysis system 10 proceeds to step 69 and executes the normal analysis operation using the analysis probe 13.

If data reconstruction is required, the emulation module 12 requests the connection of the emulation module 12 to the analysis probe 13 at step 64. The logic analysis system 10 executes the setting of the emulation module configuration registers process 90 at step 65. The setting of the emulation module configuration registers process 90 is herein defined in further detail with regard to FIG. 7. The logic analysis system 10 next executes the loading of the data map into analysis probe process 110 at step 66. The loading of the data map into analysis probe process 110 is herein defined in further detail with regard to FIG. 9. The logic analysis system 10 proceeds to step 69 and executes the analysis operation with the data reconstruction feature using the analysis probe 13.

Figure 5:
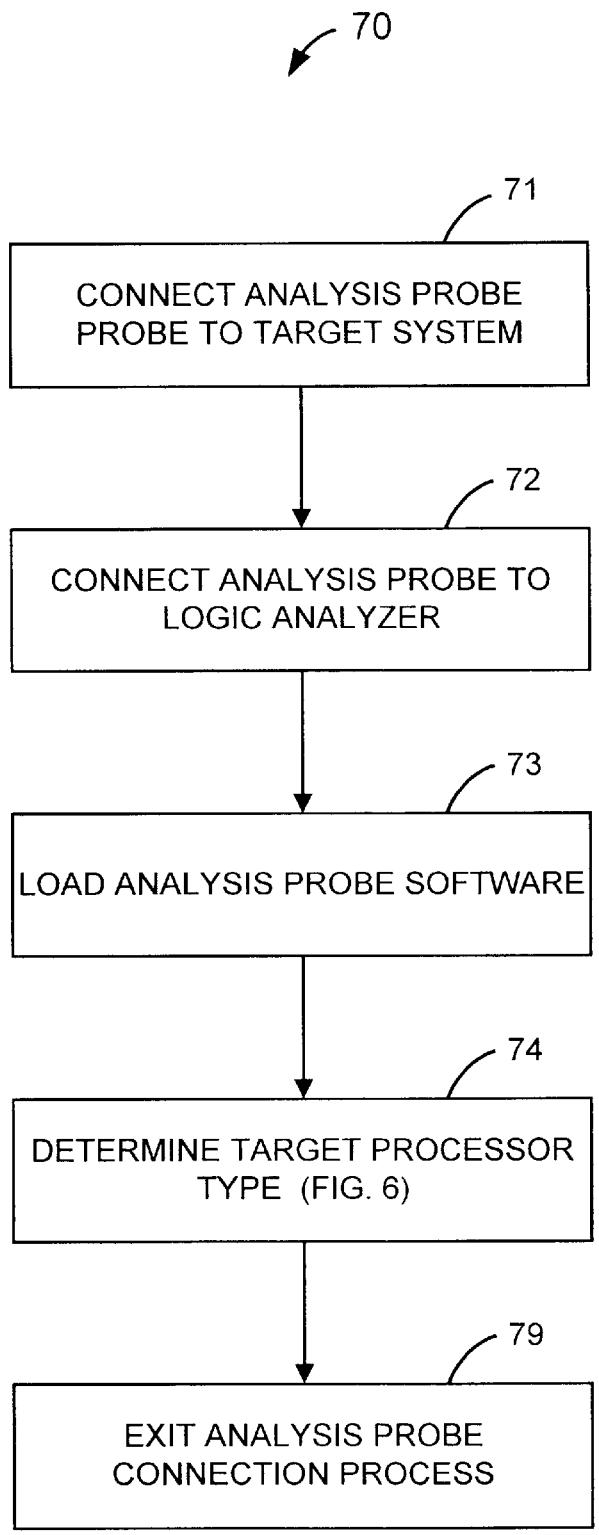
FIG. 5 is a flow chart of the process that connects the analysis probe to the target system as shown in FIG. 4.

Illustrated in FIG. 5 is a flowchart of an example of a possible implementation of an install probe process 70 for installing the analysis probe parameters (step 62 of FIG. 4). First, the analysis probe process 70 requests connection of the analysis probe 13 to the target system 14 at step 71. The logic analysis system 10 then requests connection of the analysis probe 13 to the logic analyzer 11 at step 72. Once the analysis probe 13 is connected to the target system 14 and logic analyzer 11, the analysis system 10 then requests loading of the analysis probe analyzer software at step 73. The analysis probe 13 then determines the processor type of the target system 14 at step 74. The determination of the processor type of the target system 80 process is herein defined in further detail with regard to FIG. 6. The analysis probe 13 connection process is then exited at step 79.

Illustrated in FIG. 6 is a flow chart of a possible implementation of a determination process, denoted by reference numeral 80, for determining the target system processor type. The determination of the target system processor type process 80 is first initialized at step 81.

Next, the emulation module 12 determines if the analysis probe 13 settings are to be utilized to determine what type processor the target system 14 has is performed at step 82. If the analysis probe 13 settings are not to be utilized, the emulation module 12 then requests the user to manually set the processor type of the target system 14 in the emulation module 12 memory at step 87. The emulation module 12 processor type of the target system 14 setting is determined using input from an I/O device, such as a keyboard, touch screen, mouse, network or the like connection to the emulation module 12.

If the analysis probe 13 settings are to be utilized to determine the target system 14 processor type, the emulation module 12 instructs the analysis probe 13 to retrieve the analysis probe 13 target processor connector product identification at step 83. The emulation module 12 also instructs the analysis probe 13 to send the retrieved analysis probe 13 target processor connector product identification to the emulation module 12 at step 84. The emulation module 12 then correlates the analysis probe 13 target processor connector product identification to the processor type of the target system 14 using a processor type identification table 21 at step 85.

The emulation module 12 then validates the target processor connector product identification of the analysis probe 13 at step 86. The emulation module 12 determines if the target processor connector product identification of the analysis probe 13 is found in the processor type identification table 21. If the target processor connector product identification of the analysis probe 13 is found, the emulation module 12 retains the processor type identification of the target system 14. If the analysis probe 13 product identification is not found at step 86, the emulation module 12 then generates a processor type identification not found error and reverts to the default processor type identification. After the validation step, the determination process 80 exits at step 89, and it returns to step 74 of FIG. 5.

Figure 7:
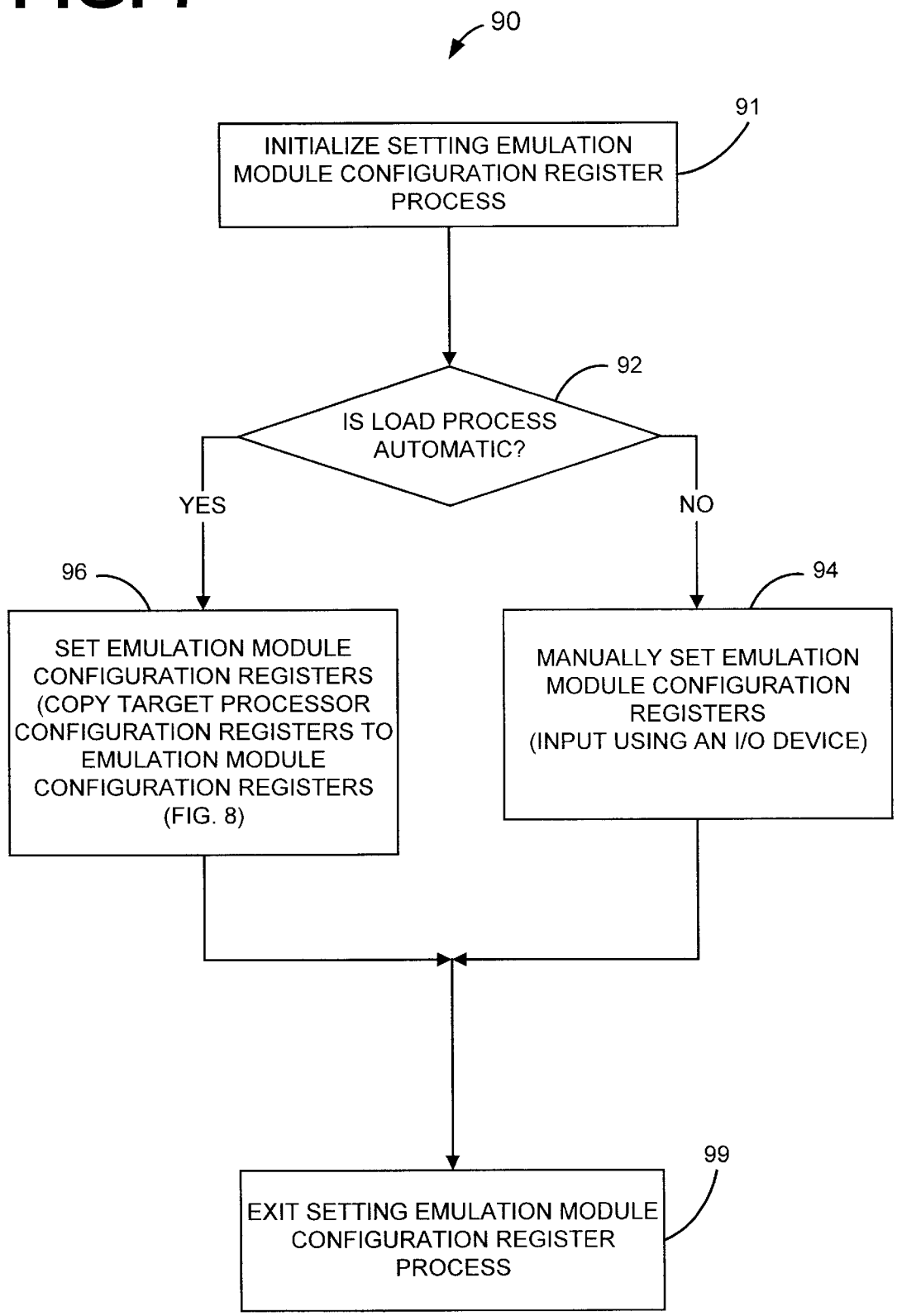
FIG. 7 is a flow chart of the process that loads the emulation module configuration registers as shown in FIG. 4.

Illustrated in FIG. 7 is a flowchart of an example of a possible implementation of the setting of the configuration registers process 90 for the emulation module 12. First, the setting of the configuration registers process 90 for the emulation module 12 is initialized at step 91. The setting of the configuration registers process 90 for the emulation module 12 next determines if the configuration registers downloading process 90 is automatic, i.e., data is to be downloaded from the configuration registers 24 of target system 14 at step 92. If the downloading process is automatic, the emulation module 12 sends a request to the target system 14 to download, i.e., copy, configuration registers 24 of target system 14 to the configuration registers 22 of the emulation module 12 at step 96. This downloading of the configuration registers 24 of target system 14 to the configuration registers 22 of the emulation module 12 is herein defined in further detail with regard to FIG. 8.

If the setting of the configuration registers process 90 is not automatic, the emulation module 12 requests the user to manually set the configuration registers 22 of the emulation module 12 at step 94. The configuration registers 22 of emulation module 12 are set by communicating an input from an input/output (I/O) device, such as a keyboard, touch screen, mouse, network or the like to the emulation module 12.

After the configuration registers downloading process 90 is complete, the process for setting the configuration registers process 90 for the emulation module 12 exits at step 99, and returns to step 65 of FIG. 4.

Figure 8:
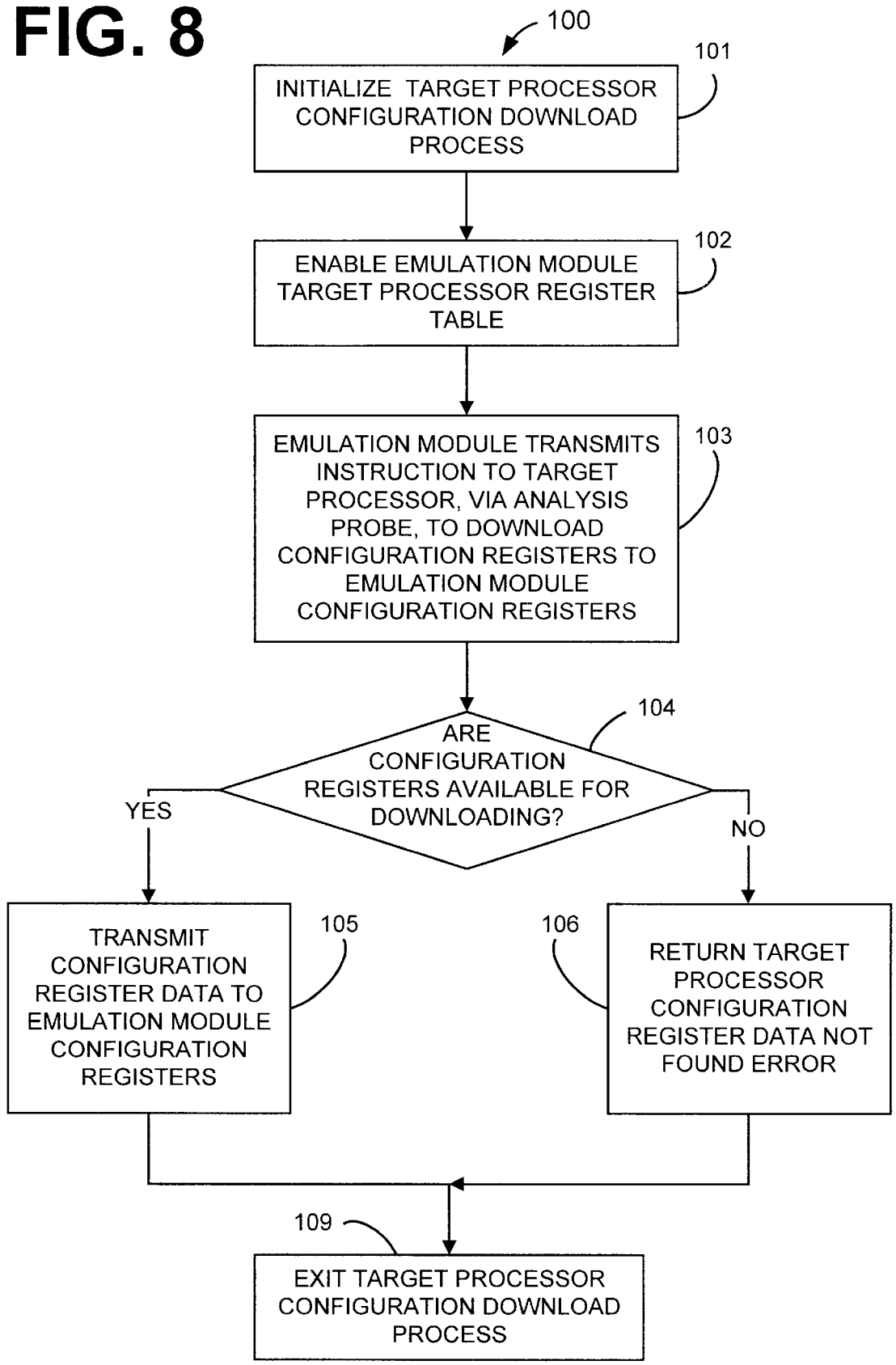
FIG. 8 is a flow chart of the process that downloads the target processor configuration data to the analysis probe as shown in FIGS. 4 and 7.

Illustrated in FIG. 8 is a flowchart of an example of a possible implementation of the target processor download configuration registers process 100. First, the target processor download configuration registers process 100 is initialized at step 101. The emulation module 12 next enables the target processor register table 23 of the emulation module 12 at step 102.

The emulation module 12 next transmit instructions to the target system 14 processor, via the analysis probe 13 connections, to download configuration registers 24 of target system 14 at step 103. This is accomplished by the emulation module 12 transmitting the control instruction requests out, via data line 48, to the programmable logic 32. The programmable logic 32 act as an interface between the emulation module 12 and the target system 14 at step 103. The programmable logic 32 retransmits the control instruction requests out, via line control line 46, to the configuration registers 24 of target system 14 at step 103.

The emulation module 12 interrogates the target system 14 to determine if there are configuration registers 24 available in the target system 14 for downloading at step 104. If the configuration registers 24 of target system 14 are not available, the emulation module 12 generates a processor configuration register data for target system 14 not found error. This error message will be displayed on any display device connected to the emulation module 12 at step 106.

If the configuration data registers 24 for the target system 14 are available for downloading at step 104, the target system 14 then transmits the configuration register 24 data of target system 14 to the configuration registers 22 of the emulation module 12 at step 105. This is accomplished by the programmable logic 32 reading the configuration registers 24 of target system 14 in to analysis probe 13 programmable logic 32. The values of the configuration registers 24 of target system 14 are next sent to the configuration registers 22 of the emulation module 12, via data lines 48. The target processor configuration download process then exits at step 109.

Figure 9:
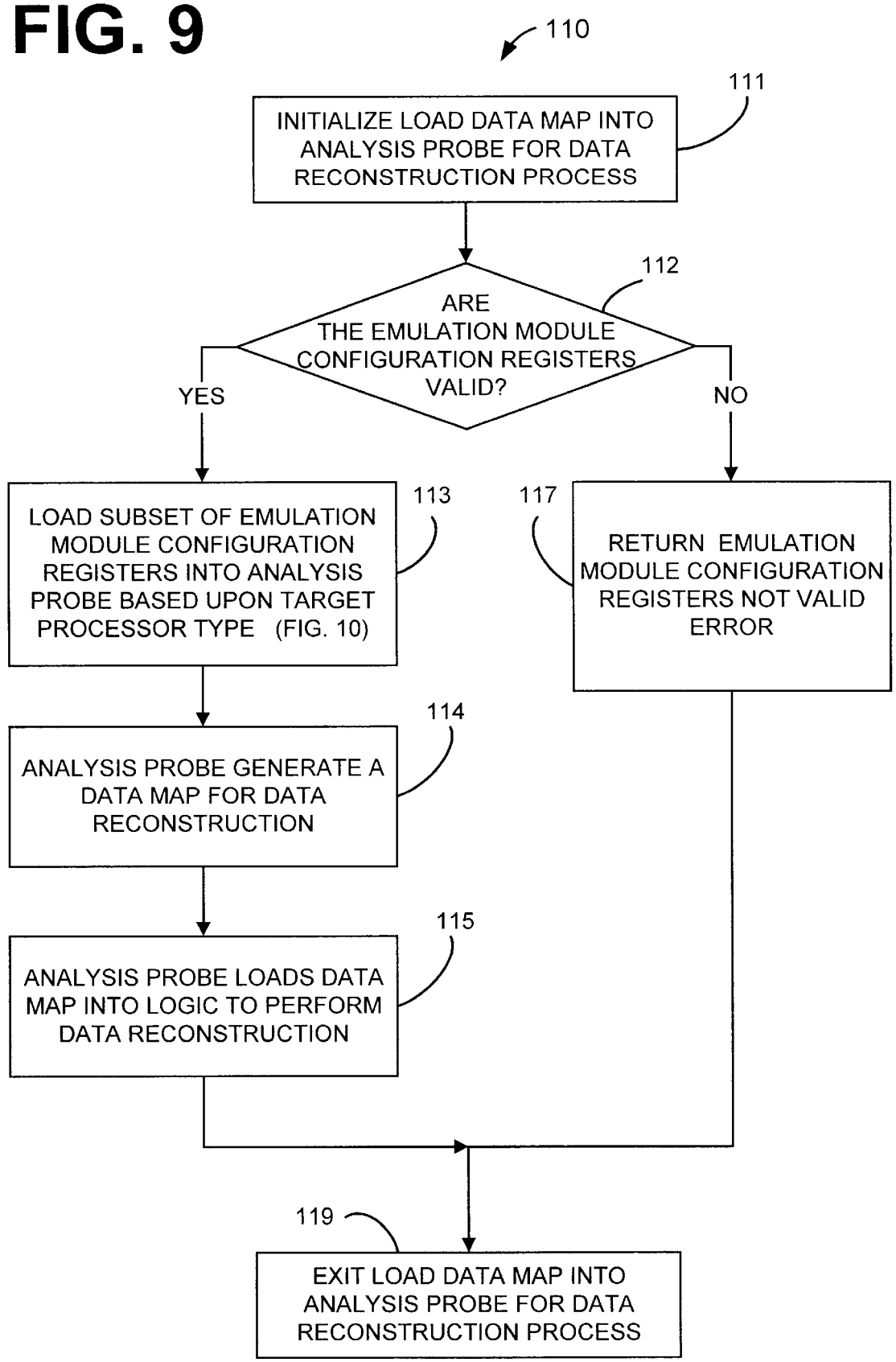
FIG. 9 is a flow chart of the process that generates the data reconstruction data map in the analysis probe to enable data reconstruction as referenced in FIG. 4.

Illustrated in FIG. 9 is a flowchart of an example of a possible implementation the data reconstruction data map generation process 110 to enable data construction. First, the data map generation process 110 is initialized at step 111.

The emulation module 12 determines if the configuration registers 22 of the emulation module 12 are valid at step 112. If the configuration registers 22 of the emulation module 12 are not valid, the emulation module 12 generates a configuration registers 22 of the emulation module 12 data not found error. This error message will be displayed on any display device connected to the emulation module 12 at step 117.

If the configuration registers 22 of the emulation module 12 are valid, the emulation module 12 then correlates the configuration registers 24 of target system 14 values in the configuration registers 22 of the emulation module 12 using a target processor register table 23 of the emulation module 12 to a subset of data reconstruction configuration registers at step 113. The emulation module 12 loads the appropriate subset of the emulation module 12 registers into the analysis probe 13 based upon the processor type of the target system 14 at step 113. This loading of a subset of configuration registers based on processor type of the target system 14 is herein defined in further detail with regard to FIG. 10.

Once the subset of emulation module 12 registers are loaded into the analysis probe 13, the analysis probe 13 generates a data reconstruction data map at step 114. This is completed when the emulation module 12 signals the analysis probe 13 microprocessor 33 that a new target system 14 processor configuration register subset has been downloaded. The emulation module 12 then initiates the execution of the microprocessor 33 algorithm to generate the data map.

Once the configuration register subset data has been processed by the algorithm on the microprocessor 33, the generated bit map is loaded into the reconfigurable program logic 30 at step 115. This enables the analysis probe 13 to provide data reconstruction operations during analysis of data from the target system 14. In one embodiment, the configuration register subset data tell the analysis probe 13 microprocessor 33 if the upper address lines 53 are going to be used as address lines or if they are going to be used for something else. The configuration register subset data also tell analysis probe 13 microprocessor 33 if the chip select lines 45 are going to be used, which ones are being used, and when chip select lines 45 are being used. The configuration registers also tell which are the effective bits that are needed to recreate the data, and what range of addresses are being created by those chip selects. From using the configuration registers, the programmable logic 30 is able to regenerate the upper address lines 53 from chip selects. It would also be obvious that the configuration registers could enable an user to reconstruct any data on the chip and retrieve it for analysis.

The data reconstruction data map generation process 110 is then exited at step 119 and returns to step 68 in FIG. 4.

Figure 10:
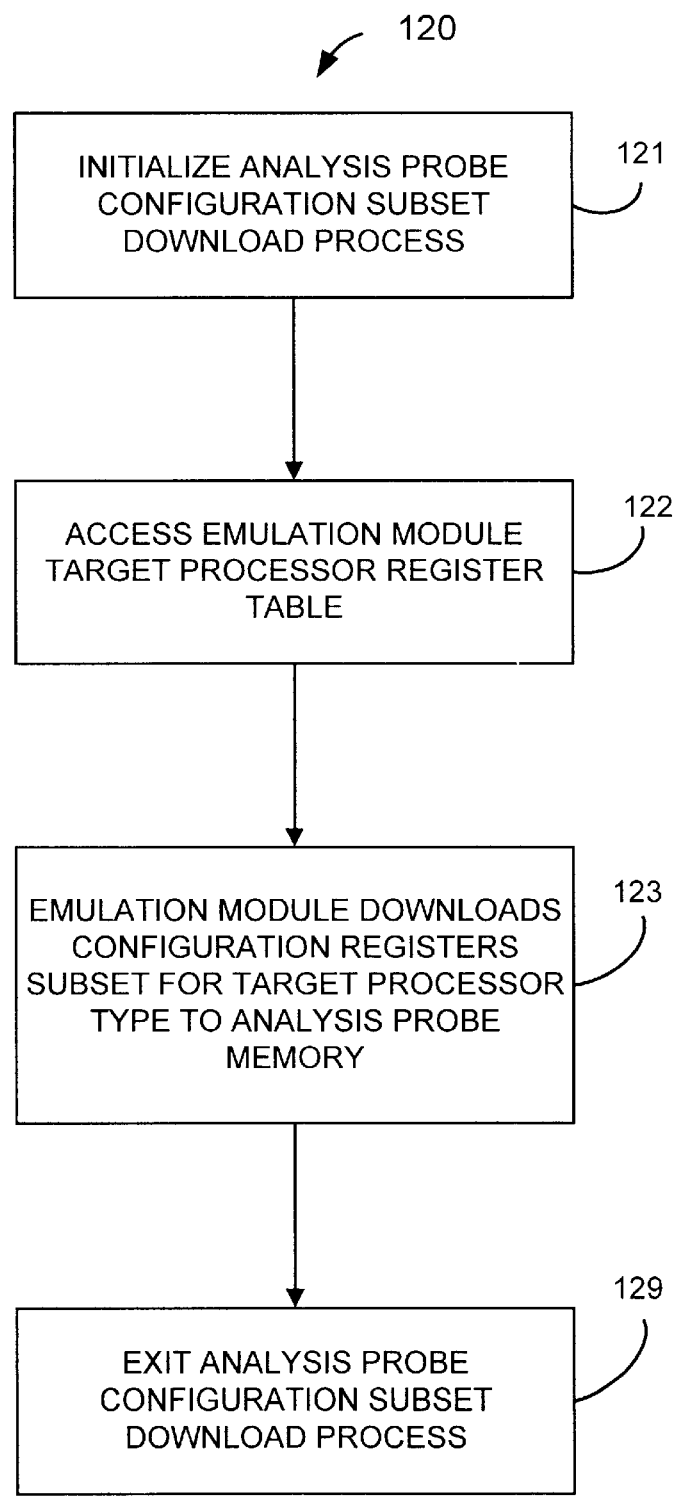
FIG. 10 is a flow chart of the process that loads the subset of emulation module registers into the analysis probe as shown in FIG. 9.

Illustrated in FIG. 10 is a flowchart of an example of a possible implementation of the analysis probe 13 configuration subset download process 120. The 13 configuration subset download process 120 is for the loading of memory storage device 31 of analysis probe 13 with the subset of configuration registers. First, the analysis probe 13 configuration subset download process 120 is initialized at step 121. The target processor register table 23 of the emulation module 12 then accesses the analysis probe 13 memory storage device 31 at step 122. The emulation module 12 downloads the configuration register subset for the target processor type to the analysis probe 13 memory storage device 31 at step 123. The proper configuration register subset being determined at step 113. The analysis probe 13 configuration register subset download process is then exited at step 129.

The reconstructing of data for the analysis probe program, comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device.

The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (magnetic), a read-only memory (ROM) (magnetic), an erasable programmable read-only memory (EPROM or Flash memory) (magnetic), an optical fiber (optical), and a portable compact disc read-only memory (CD-ROM) (optical).

Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

The foregoing description has been presented for purposes of illustration and description. It is not intended to be exhaustive or to limit the invention to the precise forms disclosed. Obvious modifications or variations are possible in light of the above teachings.

The embodiment or embodiments discussed were chosen and described to provide the best illustration of the principles of the invention and its practical application to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for reconstructing internal data signals on a computer system for analysis by a logic analyzer, said computer system connected to a signal probe, and said signal probe connected to said logic analyzer, the method comprising the steps of:

loading signal reconstruction data from an emulation logic to said signal probe;

receiving a plurality of data signals from said computer system with said signal probe;

deriving a computer system internal signal during operation from at least one of said plurality of data signals and said signal reconstruction data; and transmitting said internal signal derived during computer system operation to said logic analyzer for analysis.

2. The method of claim 1, wherein the loading signal reconstruction data step further comprises the step of:

loading computer system register data.

3. The method of claim 1, wherein the loading signal reconstruction data step further comprises the step of:

generating a data map from said signal reconstruction data to enable translation of at least one of said plurality of data signals.

4. The method of claim 3, wherein generating a data map step further comprises the step of:

loading said data map in a signal reconstruction logic, said signal reconstruction logic connected to said plurality of data signals.

5. The method of claim 1, further comprising the steps of:

acquiring computer system processor type data;

determining the signal reconstruction data from said computer system processor type data; and calculating a data map from said signal reconstruction data, said data map for generating said computer system internal signal from said at least one of said plurality of data signals.

6. A reconstruct apparatus for generating internal data signals for a target system for analysis by a logic analyzer, said reconstruct apparatus comprising:

a first programmable logic for providing an interface between an emulation module and the target system;

a memory for receiving signal reconstruction data from said emulation module;

a processor, connected to said memory, for generating a data map from said signal reconstruction data; and a second programmable logic, connected to said processor, for receiving said data map and for generating internal data signals from at least one of a plurality of target system data signals and said data map.

7. The apparatus of claim 6, wherein said second programmable logic further comprises:

a receive interface to receive said plurality of target system data signals; and a transmit interface to transmit said target system internal signal to a logic analyzer.

8. The apparatus of claim 6, wherein said signal reconstruction data further comprises:

a subset of target system data that correlates to a predetermined internal target system signal to be generated.

9. The apparatus of claim 6, wherein said first programmable logic further determines a processor type of said target system.

10. The apparatus of claim 6, wherein said first programmable logic further transmit control data to said target system.

11. A data reconstructing apparatus for generating internal data signals for a computer system for analysis by a logic analyzer, said reconstructing apparatus comprising:

means for receiving signal reconstruction data from an emulation logic and a plurality of data signals from said computer system;

means for deriving a computer system internal signal during operation from at least one of said plurality of data signals and said signal reconstructing data; and means for transmitting said internal signal derived during computer system operation to said logic analyzer for analysis.

12. The apparatus of claim 11, further comprising:

means for determining a processor type of said computer system.

13. The apparatus of claim 11, further comprising:

means for transmitting control data to said computer system.

14. The apparatus of claim 11, further comprising:

means for receiving control data from said emulation logic.

15. The apparatus of claim 11, wherein said processor type determination means further comprises:

means for determining an identification of a probe product from said data signals receiving means.

16. A computer readable medium for reconstructing internal data signals for a computer system for analysis by a logic analyzer, comprising a plurality of blocks of code, said computer readable medium comprising:

a computer readable recording medium;

a means recorded on the medium for controlling the execution of said plurality of blocks of code;

a means recorded on the medium for receiving signal reconstruction data from an emulation logic;

a means recorded on the medium for receiving a plurality of data signals from said computer system;

a means recorded on the medium for generating said internal data signals, during operation, wherein said generating means is reprogrammable; and a means recorded on the medium for transmitting said internal data signals derived during computer system operation to said logic analyzer for analysis.

* * * * *